United States Patent
Duffy et al.

[11] Patent Number: 5,196,850
[45] Date of Patent: Mar. 23, 1993

[54] FOURTH ORDER DIGITAL DELTA-SIGMA MODULATOR

[75] Inventors: Michael L. Duffy; Navdeep S. Sooch, both of Austin, Tex.

[73] Assignee: Crystal Semiconductor, Austin, Tex.

[21] Appl. No.: 791,977

[22] Filed: Nov. 13, 1991

[51] Int. Cl.$^5$ .............................................. H03M 3/00
[52] U.S. Cl. ...................................... 341/76; 375/28; 341/143
[58] Field of Search .................. 341/76, 77, 143, 144, 341/152, 155; 375/27, 28, 29, 30, 33

[56] References Cited

U.S. PATENT DOCUMENTS

| | | | |
|---|---|---|---|
| 5,012,244 | 4/1991 | Wellard et al. | 341/143 |
| 5,061,925 | 10/1991 | Sooch et al. | 341/120 |
| 5,087,914 | 2/1992 | Sooch et al. | 341/120 |

Primary Examiner—A. D. Pellinen
Assistant Examiner—Brian K. Young
Attorney, Agent, or Firm—Gregory M. Howison

[57] ABSTRACT

A delta-sigma modulator for a digital-to-analog converter includes a single adder (60) that has one input thereof multiplexed by multiplexer (62). Four shift registers (64), (66), (68) and (70) are connected in a serial fashion such that the data output by the adder (60) is input to the shift register (64) and the other input of adder (60) is connected to the output of register (70). In operation, the multiplexer (62) first selects the input data for input to the one input of adder (60) and selects the output of register (70) for the other input. This represents the first stage of integration wherein the accumulated value from a previous cycle is added to the present data. The output of the first stage of integration will be cycled through the registers for each overall cycle of the delta-sigma modulator. In the second stage of integration on the next clock cycle of the 4× clock, the multiplexer (62) selects the output of the register (68) for adding to the output of the register (70). This represents the operation of the second stage of integration. The output of register (64) represents the output of each stage of integration after the accumulation step, which is then input to one of four shift left registers (82)–(88), which performs a gain scaling function. An overflow condition is also accommodated with an exclusive-OR gate (78).

28 Claims, 5 Drawing Sheets

FOURTH ORDER DIGITAL DELTA-SIGMA MODULATOR

TECHNICAL FIELD OF THE INVENTION

The present invention pertains in general to digital-to-analog converters and, more particularly, to the delta-sigma modulator architecture utilized in the digital portion thereof.

BACKGROUND OF THE INVENTION

Present digital-to-analog conversion techniques make use of various oversampling conversion techniques. These typically utilize a delta-sigma modulator in conjunction with conventional oversampling noise shaping techniques utilizing digital filters. Typically, an interpolation filter is utilized to increase the sample rate and then remove high frequency images at $f_s/2$ and above, $f_s$ being the input sampling frequency. The interpolation filter provides a factor of $64\times$ increase in the sampling rate. The delta-sigma modulator receives the output of the interpolation filter and converts the digital word into a one-bit digital data stream. This one-bit output controls a one-bit DAC, which converts the signal to a continuous time analog signal. This signal is then input to an analog low pass filter.

One disadvantage of the present delta-sigma modulator is the complexity thereof. These modulators are typically configured of a plurality of cascaded accumulators. The accumulators are formed with a register and an adder such that the overall modulator requires a plurality of additions to be performed and the results are then accumulated over time. However, the circuitry required to realize large order delta-sigma modulators is significant. This is primarily due to the complexity of the digital adder required in wide data path designs. There therefore exists a need for a more efficient circuit design for the delta-sigma modulator to reduce the amount of circuitry required to perform the multiple stages of integration.

SUMMARY OF THE INVENTION

The present invention as disclosed and claimed herein comprises an nth order delta-sigma modulator for use in a digital-to-analog converter for receiving an m-bit digital word at an input sampling rate and converting it to an m'-bit digital word, m' less than m. The delta-sigma modulator includes an input summing junction for receiving a digital input and a feedback value and generating the sum thereof. N integration stages of modulation are provided, each having a feed-forward path and associated scaling factor. An output summing junction is operable to sum the output of each of the feed-forward paths and a quantizer is provided for generating the m'-bit output of the delta-sigma modulator. The n integration stages are realized with a single multiplexed adder having two inputs. A data register medium is provided for temporarily storing the accumulated value of the adder, and controlled by a multiplexing device. The multiplexing device is operable to multiplex the operation of the adder for each word received on the input to the delta-sigma modulator and perform n summations for both the input value and the previously stored value in the data register medium. This allows the operations of each of the integration stages to be performed by the single adder. The outputs of the adder are stored in the data register medium as accumulated results. An output device selects the accumulated values for input to the output summing junction after generation thereof in accordance with the operation of the associated integration stage. The output device also performs the associated scaling operations.

In another aspect of the present invention, the data register medium is comprised of n dynamic data registers arranged in a serial configuration. The output of the adder is connected to the input of the first register in the serial configuration and the output of the last register in the serial configuration is input to one input of the adder. The other input of the adder is controlled by a multiplexing device to select either the output of the input summing junction or the output of the next to the last register in the serial configuration. The operation is multiplexed such that n summations are performed for each digital word received from the output of the input summing junction, with the first summation operation receiving the output of the input summing junction and the output of the last of the data registers in the serial configuration. This is operable to perform the operation of the first integration stage and store the output result in the first of the data registers in the serial configuration. The data is then sequenced through the serial configured data registers and the next accumulated data value presented to the one input of the adder, and the data in the next to the last of the data registers presented to the other input of the adder for storage in the first of the data registers.

The output device for selecting the accumulated value selects the output of the first data register in the serial configuration and inputs it to one of n scaling devices for performing a scaling operation, each scaling operation associated with one of the stages of integration An output device selects the data output by the scaling device corresponding to the stage of integration having the accumulated results stored in the first data register, and then outputs this selected data to the output summing junction.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
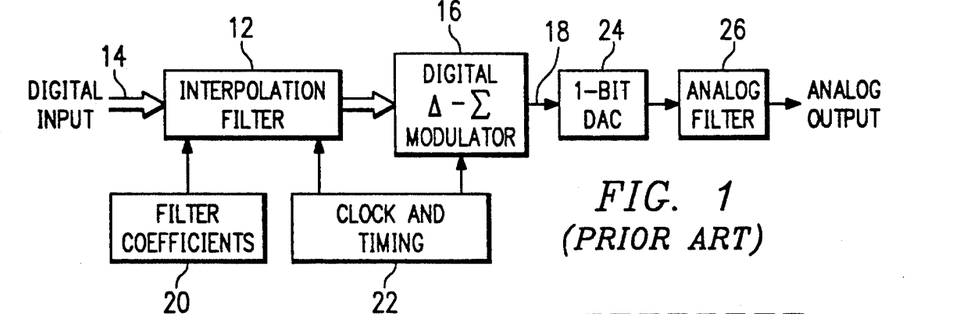
FIG. 1 illustrates a general block diagram of the a digital-to-analog converter.

Referring now to FIG. 1, there is illustrated a digital-to-analog converter system (DAC). The DAC system is comprised of an interpolation filter 12 that is operable to receive a digital input on a digital input bus 14. The interpolation filter 12 is operable to increase the sampling rate of the digital input signal on bus 14. The output of the interpolation filter 12 is input to a digital delta-sigma modulator 16 that is operable to convert the digital input signal output by the interpolation filter 12 into a one-bit digital stream on output 18. The interpolation filter 12 is controlled by a plurality of filter coefficients stored in a memory 20, which filter coefficients are typically associated with a Finite Impulse Response (FIR) filter. Clock and timing circuitry 22 is provided for generating the various clock signals for use in interpolating the data and also in performing the digital delta-sigma modulator function of block 16 in accordance with the present invention, as will be described in more detail hereinbelow.

The output of the digital delta-sigma modulator 16 is comprised of a one-bit output data stream. However, it should be understood that it could be any type of m-bit output, with m being greater than or equal to one. Also, it should be understood that any of one-bit quantizer or equivalent could be utilized to provide the conversion to the one-bit digital stream. The delta-sigma modulator is utilized as it provides good low level performance and differential non-linearity. The general operation of the interpolation filter 12 and digital delta-sigma modulator 16 is known in the art and described in Yasuykuy Matsuya, Kuniharu Uchimura, Atsushi Awaiti and Takayo Kaneko, "A 17-Bit Oversampling D-to-A Conversion Technology Using Multi-Stage Noise Shaping", IEEE J. of Solid-State Circuits, Vol. 24, No. 4, August 1989 and P. J. Naus, E. C. Dijkmans, E. F. Stikvoort, A. J. McKnight, D. J. Holland and W. Bradinal, "A CMOS Stereo 16-Bit D/A Converter for Digital Audio", *IEEE J. of Solid-State Circuits*, Vol. SC-22, No. 3, June 1987, which is incorporated herein by reference.

The output of the digital delta-sigma modulator on line 18 is input to a one-bit DAC 24 to convert the one-bit digital stream into an analog signal. The output of the one-bit DAC is input to a low pass analog filter 26 to filter out the higher order components that were not filtered out by the interpolation filter 12. The general operation of the circuit of FIG. 1 is described in U.S. patent application Ser. No. 571,375, filed Aug. 22, 1990, and entitled "DC Calibration System for a Digital-to-Analog Converter," "issued as U.S. Pat. No. 5,087,914," which is incorporated herein by reference, and also described in U.S. patent application Ser. No. 571,376, filed Aug. 22, 1990, and entitled "Phase Equalization System for a Digital-to-Analog Converter," "issued as U.S. Pat. No. 5,061,925," which is incorporated herein by reference.

Figure 2:
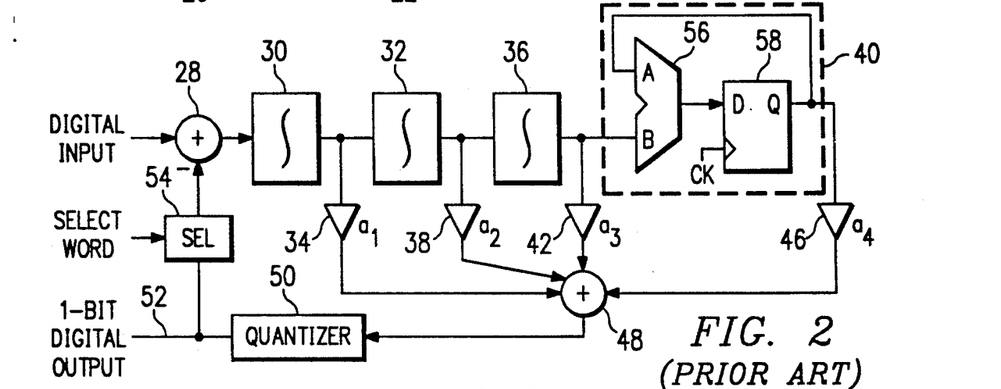
FIG. 2 illustrates a block diagram of a conventional delta-sigma modulator architecture.

Referring now to FIG. 2, there is illustrated a generalized block diagram of the fourth-order digital delta-sigma modulator which is input to a summing junction 28 and then to a first stage of integration 30. The output of the first stage of integration is then input to the second stage of integration 32 and also to the input of a feed-forward path 34. The output of the integrator 32 is input to a third stage of integration 36 and also to the input of a feed-forward path 38. The output of the integrator 36 is input to a fourth stage of integration 40 and also to the input of a third feed-forward path 42. The output of the fourth stage of integration 40 is input to the input of a fourth feed-forward path 46. The feed-forward paths 34, 38, 42 and 46 each have coefficients $a_1$, $a_2$, $a_3$ and $a_4$, respectively, associated therewith. In the preferred embodiment, the feed-forward paths 34, 38, 42 and 46 provide a gain, which gain is one-half, one-eighth and one-sixty-fourth, respectively, for the coefficients $a_1$, $a_2$, $a_3$ and $a_4$.

Each of the feed-forward paths 34, 38, 42 and 46 are input to a summing junction 48, the output of which is input to a one-bit quantizer 50 that converts the output of the summing conjunction 48 into a signal that is plus or minus full scale. The output of the quantizer 50 provides the one-bit digital output on the line 52. The output of the quantizer 50 is also input through a select block 54 back to the negative input of the summing junction 28 to provide negative feedback. The select block 54 is operable to select one of two feedback words that are input to the summing junction 28.

The structure of each of the integrators 30, 32, 36 and 40 is illustrated in detail within dotted lines that comprise the integrator 40. An adder 56 is providing having two inputs, A and B, and an output which is input to the D-input of a register 58. The register 58 is clocked to clock the data on the input thereof to the Q-output, which output is both input to the feed-forward path 46 and also back to the A-input of the adder 56, the B-put thereof receiving the output from the third stage of integration 36. The combination of the adder 56 and register 58 provides an accumulator function. In the normal configuration, each of the integrators 30, 32, 36 and 40 perform the same function. As will be described hereinbelow, the apparatus of the present invention utilizes a single adder to perform the functions of the four integrators with four separate registers, the operation of the adder multiplexed and operating at a higher rate than the base clock rate of the modulator.

Figure 3:
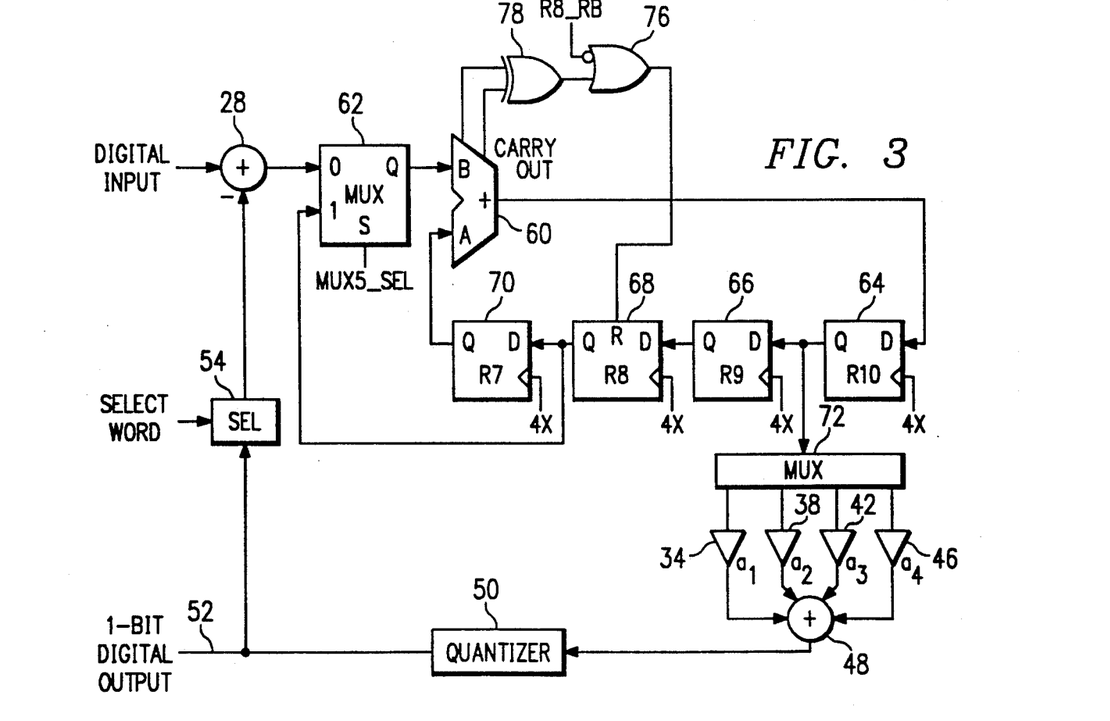
FIG. 3 illustrates a block diagram of the multiplexed adder utilizing the modulator portion of the delta-sigma modulator.

Referring now to FIG. 3, there is illustrated a detailed block diagram of the four integrators 30, 32, 36 and 40 utilizing a single adder 60 that is multiplexed to operate four times during each cycle of the modulator. The output of the summing junction 28 is input to the 0-input of the multiplexer 62. The output of the multiplexer 62 is input to the B-input of the adder 60. The output of the adder 60 is input to the D-input of a register 64, which is labeled R10. The output of the register 64 is input to the D-input of a register 66, which is labeled R9. The output of the register 66 is input to the D-input of a register 68, which is labeled R8. The output of the register 68 is input to the D-input of a register 70, which is labeled R7. The output of the register 70 is input to the A-input of the adder 60. Further, the output of the register 68 is input to the 1-input of the multiplexer 62.

Each of the registers 64, 66, 68 and 70 are dynamic registers which are clocked at a rate that is four times the sampling rate of the delta-sigma modulator 16. This clock rate is available from the clock and timing circuit 22 that is utilized to provide the higher rate to the interpolation filter 12. Therefore, the clock rate is one that normally exists in the operation of an interpolation filter in association with the delta-sigma modulator in a DAC. Since the clock rate runs at 4× the input rate to the delta-sigma modulator, each of the registers 64–70 will clock data through at four times the rate that normally would be clocked through any of the integration stages in a conventional delta-sigma modulator.

The output of register 64 is input to a single input on a multiplexer 72. The multiplexer 72 has four outputs which are each connected to the input of the four feed-forward paths 34, 38, 42 and 46. The multiplexer 72 operates to tap the output of the register 64 at the appropriate time in the timing cycle and effect a connection to one of the feed-forward paths 34, 38, 42 and 46. The output of register 64 constitutes the output of each of the stages of integration 30, 32, 36 and 40. The multiplexer 72 is operable to select each of these outputs for presentation to the input of summing junction 48.

As will be described hereinbelow, the register 68 is resettable in a number of operations. In one operation, an external reset signal R8_RB is generated and input to one input of and OR gate 76, the output of which is connected to the reset input of the register 68. In another mode of operation, the system is operable to generate a reset in an overflow condition. In a conventional manner, the two most significant bits of the Carry Out from the adder 60 are input to two inputs of an Exclusive-OR gate 78, the output of which is connected to the other input of the OR gate 76. In this manner, whenever an overflow condition occurs, a corrective action is taken to avoid an unstable system.

In operation, it can be seen that the multiplexed operation of the adder 60 does not latch the contents thereof for a later accumulation operation. Rather, the adder continually sums the output of one register, generates an output and then pipelines the output for later accumulation operations. Initially, the multiplexer 62 is controlled to select the 0-input for the digital data input at the beginning of the cycle. This input is input to the B-input of the adder 60 and the accumulated value from the previous cycle, and the output of register 70 is then added thereto and this presented to the input of register 64. Since there are four registers 64, 66, 68 and 70, it can be seen that it takes more clock cycles to move the value from the input of register 64 to the output of register 70.

In the next clock cycle, the multiplexer 62 is configured to select the output of register 68 for input to the B-input of the adder 60. At this point, the output of register 70 now represents the output of the first stage of integration in the previous cycle and the output of register 68 represents the output of the second stage of integration in the previous cycle. This is then added and presented the input of register 64. This cycle continues, based upon four cycles for every data word that is presented to the input of the summing junction 28.

Figure 4:
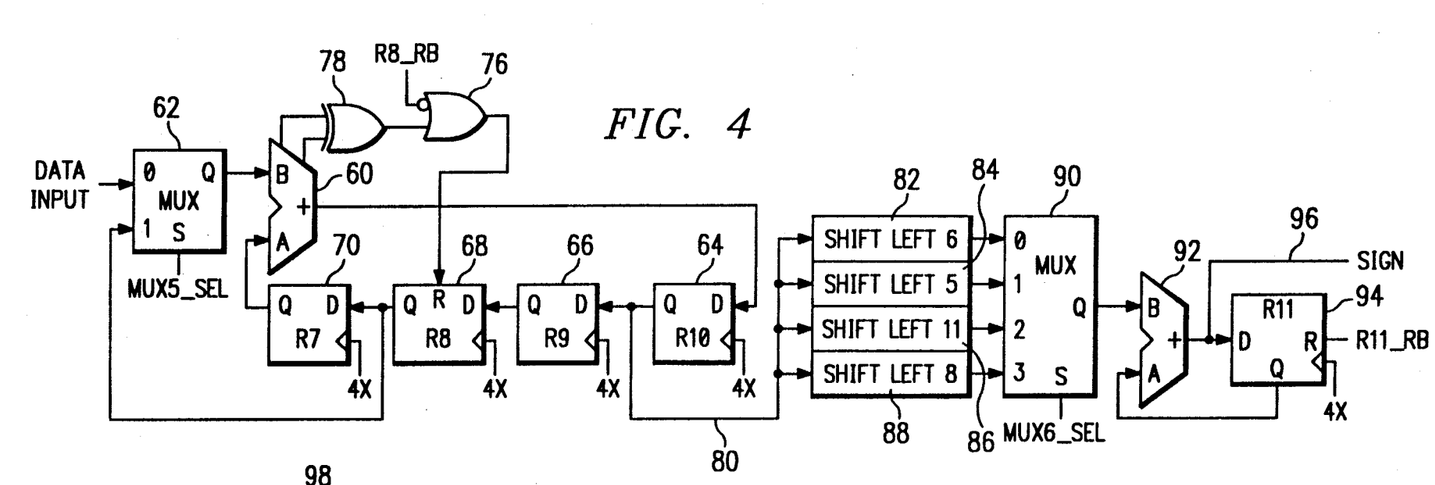
FIG. 4 illustrates a detailed block diagram of the overall modulator in the preferred embodiment.

Referring now to FIG. 4, there is illustrated a more detailed block diagram of the multiplexer 72 and the summing junction 48. The output of the register 64 is presented on line 80, which comprises a 25-bit bus, to four shift left blocks 82, 84, 86 and 88, corresponding to the feed-forward paths 38, 34, 46 and 42. The shift left blocks 82-88 essentially comprise a "hard-wired" operation wherein a predetermined number of the least significant bits of the data bus are deleted and the next bits now comprise the least significant bits, which are routed to the output, which is comprised of a 21-bit data bus. The vacated most significant bits are filled with sign bits. The block 82 provides a shift left of six bits. The shift left block 84 provides a shift of five bits, the shift left block 86 provides a shift of eleven bits and the shift left block 88 provides a shift left of eight bits. This essentially provides the scaling functions $a_1$, $a_2$, $a_3$ and $a_4$. For example, the original 25-bit input that is input to shift left block 82 would drop its bits from zero to six such that bit seven would now comprise the zero-bit output from the shift left block 82.

The output of the shift left blocks 82-88 are input to four inputs of a multiplexer 90 that is controlled by a signal MUX6_SEL, the output of which is input to the D-input of an adder 92. The output of the adder 92 is input to the D-input of a register 94 which is labeled R11. The Q-output thereof is input back to the A-input of the adder 92. The adder 92 and register 94 operate as an accumulator with the register 94 reset by reset signal R11_RB which is asserted once every cycle. Therefore, the accumulation is done on a cycle by cycle basis. The output of adder 92 then has the sign bits selected therefrom and output on a line 96 as the overall sign bit which effectively comprises the output of the delta-sigma modulator. As described above, this is an input to the select block 54.

The preferred embodiment "illustrated in FIG. 5" implements the input section by including therein one of the filter stages from a previous stage of filtering, as illustrated by reference numeral 98. The filter section is comprised of an adder 100 having the B-input thereof connected to the output of a previous stage and the output thereof connected to the D-input of a register 102, the Q-output of the register 102 comprises the output of the stage 98. This is input to an additional summing junction 104 that receives on the other summing input thereof an offset signal. This is provided such that an offset signal can be introduced into the operation of the delta-sigma modulator during a normal operation. The output of summing junction 104 then comprises the input of the summing junction 28. In operation, the input section must operate to perform three summations, one represented by the adder 100, one represented by the summing junction 104 and one represented by the summing junction 28.

Figure 5:
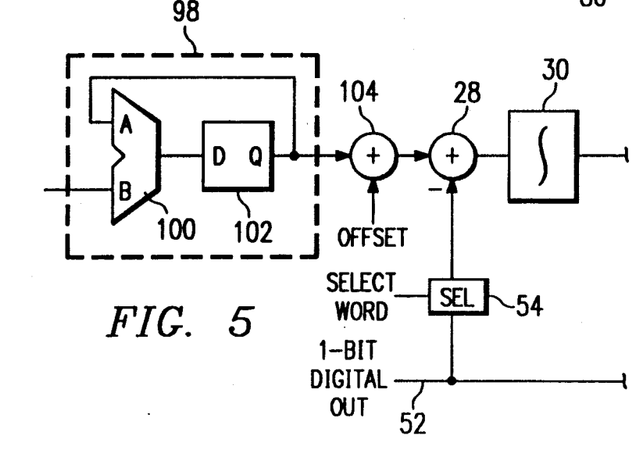
FIG. 5 illustrates a detail of the input section to the delta-sigma modulator in the preferred embodiment.
Figure 6:
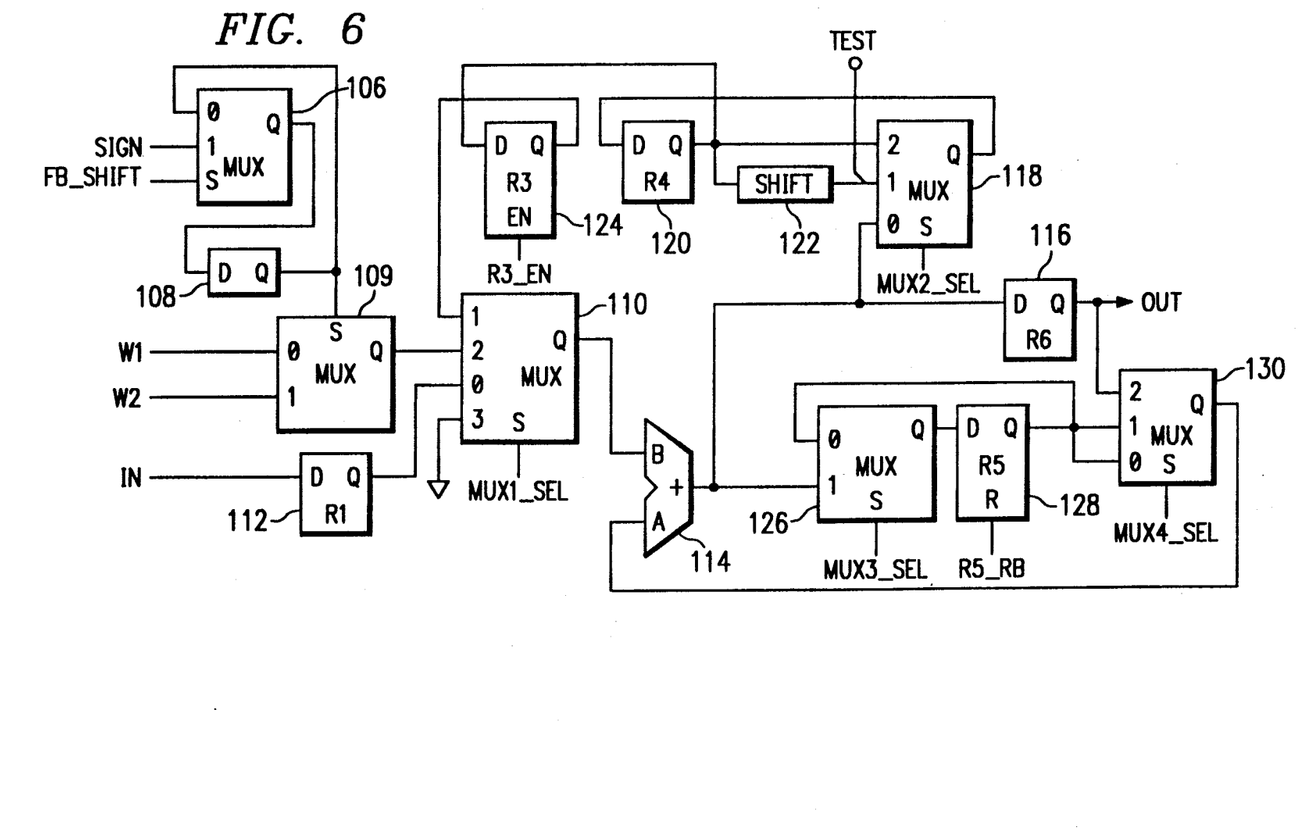
FIG. 6 illustrates a detailed block diagram of the input section in the preferred embodiment.

Referring now to FIG. 6, there is illustrated a detailed block diagram of the input section represented by the simplified block diagram of FIG. 5. The SIGN output from the modulator portion of FIG. 4 is input to the 1-input of a multiplexer 106, which is controlled by a signal FB SHIFT. The output of multiplexer 106 is connected to the D-input of a register 108, the output of which is input back to the 0-input of multiplexer 106. The output of register 108 is also input to the select input of a multiplexer 109. The multiplexer 109 represents the operation of the select block 54. There are two feedback words W1 and W2 which are feedback words that are selectable by the output signal on register 108, this being either a logic "1" or logic "0". The output of multiplexer 109 is then input to the 2-input of a multiplexer 110, which is controlled by a signal MUX1_SEL. The 0-input of multiplexer 110 comprises the output of a register 112 which has the D-input thereof connected to the data input, this register 112 being labeled R1. This comprises the overall input to stage 98.

The output of register 110 is input to the B-input of a multiplexed adder 114. The output of adder 114 is connected to the D-input of a register 116, the output of which represents the output of the summing junction 28 which also represents the input to the 0-input of the multiplexer 62 in FIG. 4. The output of adder 114 is also input to the 0-input of a multiplexer 118, which is controlled by a signal MUX2_SEL. Multiplexer 118 has the output thereof connected to the D-input of a register 120, which is labeled R4. The Q-output of register 120 is input to the 2-input of multiplexer 118. The Q-output of register 120 is also input through a shift block 122 to the 1-input of multiplexer 118. The shift block 122 represents a shift of one bit whereas the output of the register 120 is a 23-bit output and the output of shift block 122 is a 22-bit output. Additionally, a serial test word can be serially input to the 1-input of multiplexer 118 as the MSB of an input word which is comprised of 22 MSBs of the output of register 120 and the test bit, such that one bit of the test word can be input for each word output by register 120. The output of register 120 is also input back to the D-input of a register 124 which is a latch and is enabled by signal R3_EN. The output of register R3, which is a latched output, is input back to the 1-input of the multiplexer 110.

The adder 114 also has the output thereof input to the 1-input of a multiplexer 126, which is controlled by a select signal MUX3_SEL. The output of multiplexer 126 is input to the D-input of a register 128 labeled R5, the output thereof input back to the 0-input of multiplexer 126. The output of register 128 is also input to both the 1-input and the 0-input of a multiplexer 130 which is controlled by a signal MUX4_SEL. The output of the 2-input of multiplexer 130 is connected to the output of the register 116 and the output of multiplexer 130 is connected back to the A-input of adder 114.

Figure 7:
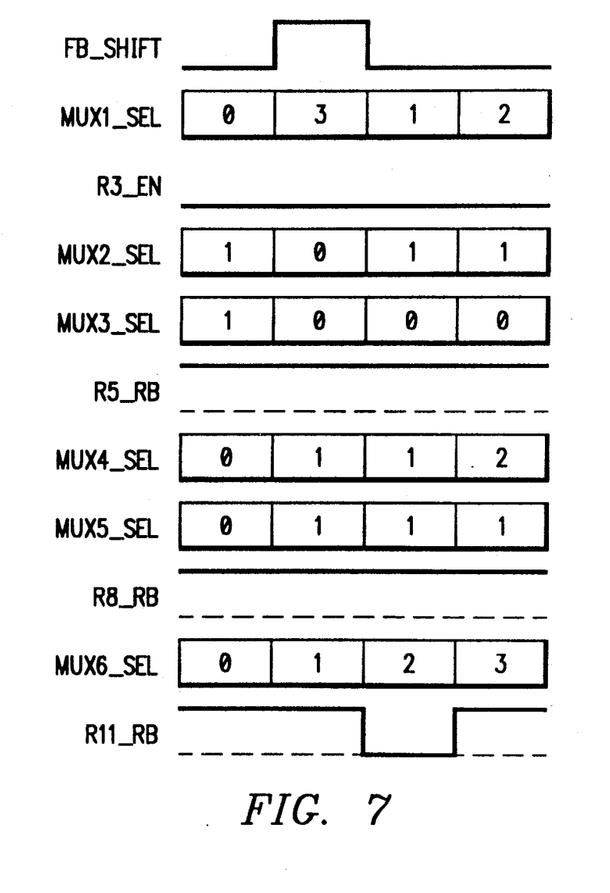
FIG. 7 illustrates the timing diagraming for the normal operation of the modulator.

In operation, the circuit of FIG. 6 operates in a normal operation wherein the delta-sigma modulator is not cleared or reset, nor is offset information loaded therein. The normal operation is illustrated by the timing diagram of FIG. 7. It can be seen that the adder 114 has the input thereof selected from either the input data input stored in register 112, the feedback word output by multiplexer 108, or the output of register 124. Further, the 3-input of multiplexer 110 is connected to ground for selecting a 0-voltage level. The adder 114 operates to first receive the digital input from register 112 for summing with the output of register 128, which output comprises a one cycle delay. This register is resettable by a signal R5_RB. It can be seen that the multiplexer 126 is operable to perform a latch function for three cycles by selecting the 0-input thereof. At the end of the fourth cycle, multiplexer 130 selects the output of the register 128, inputs it to the A-input of adder 114 and sums this value with the next input value output by register 112. The multiplexer 126 then inputs this to the D-input of register 128 and cycles this again.

The adder 114 is also operable to receive the sign bit on the B-input thereof and to receive the output of register 116. The output of register 116 represents the sum of the output of register 128 and the output of register 124, and also the output of multiplexer 109.

Figure 8:
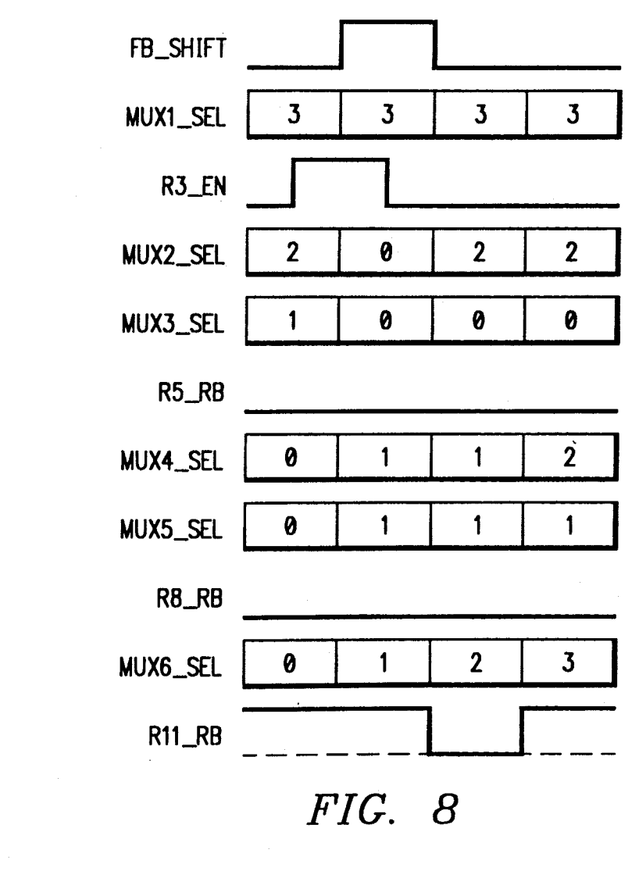
FIG. 8 illustrates the timing diagram for the clearing/resetting operation of the modulator.

When the system needs to be cleared, this is represented by the timing diagrams of FIG. 8. In the clear operation, the multiplexer 110 is operable to select the 3-input thereof to place a zero on the B-input of adder 114. Multiplexer 118 is then controlled to load the output of adder 114 into register 120 and then cycle this until the next cycle before latching onto the output of register 124. As noted, this loading operation is controlled to occur between two of the 4× clock cycles. The cycle continues with a zero value input on the B-input of adder 114. This will result in a clearing operation with the proper state of register 124 occurring for normal operation. Signals R5_RB and R8_RB are asserted to clear registers 128, 70, 68, 66 and 64.

Figure 9:
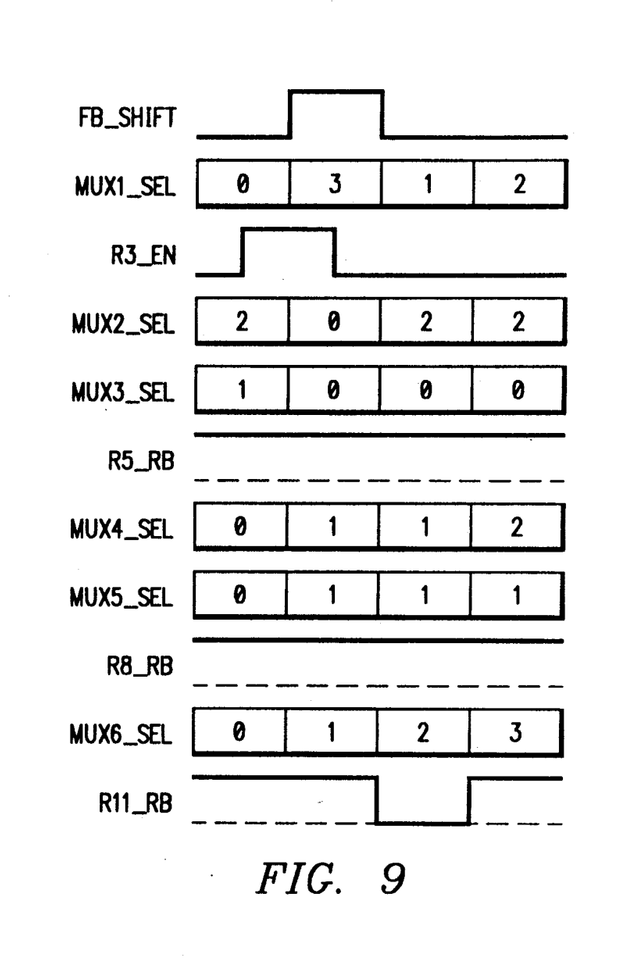
FIG. 9 illustrates timing diagrams for the offset loading operation.

For offset loading, the timing diagram of FIG. 9 is referred to. In this operation, the multiplexer 110 is operable to initially select an input offset value from register 112 and store it in register 128. The next step selects the 3-input of multiplexer 110 to add the value of zero to the contents of register 128. The value in register 128 is then moved to register 120 with the add zero operation. In the next step the value is moved to register 124, where the offset value is stored.

Figure 10:
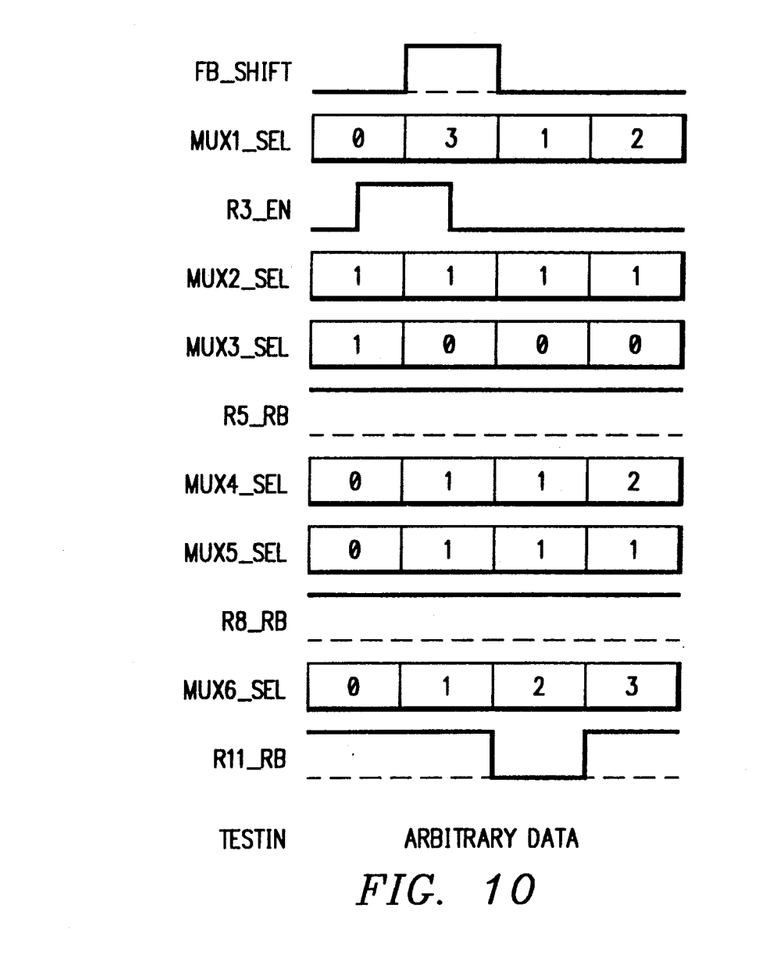
FIG. 10 illustrates timing diagrams for loading test values into Register R3.

Referring to FIG. 10, there is illustrated a timing diagram for inputting test data. The test data is input one bit at a time from LSB to MSB.

In summary, there has been provided a delta-sigma modulator for use in the digital-to-analog converter that utilizes a multiplexed adder configuration. In the multiplexed adder configuration, a single adder is utilized to perform the additions required by multiple cascaded integration stages. The operation utilizes a series of four registers corresponding to four stages of integration which are connected in a serial fashion to the output of the multiplexed adder. The registers are dynamic registers that are shifted at a clock rate that is four times the sampling rate of the digital data input to the delta-sigma modulator. The output of each of the registers at any given time represents the accumulated value from a previous cycle, which accumulated value is sequentially shifted through the registers for presentation to one input of the adder. During operation, the first stage of integration is represented by the output of one of the serial registers, representing the accumulation value from the previous cycle. In subsequent cycles of the 4× clock, the other input of the adder is connected to the previous shift register, representing the accumulated output of the previous integration stage in the previous cycle.

Although the preferred embodiment has been described in detail, it should be understood that various changes, substitutions and alterations can be made therein without departing from the spirit and scope of the invention as defined by the appended claims.

What is claimed is:

1. A delta-sigma converter of nth order for a digital-to-analog converter for receiving an m-bit digital word at a first sampling rate and converting it to an m'-bit word, m' being less than m, comprising:
   an input summing junction for receiving as a digital input the m-bit digital word and a feedback value and generating the sum thereof;
   n integration stages of modulation, select ones thereof having a feed-forward path and a scaling factor associated therewith;
   an output summing junction for receiving an output of each of said feed-forward paths and generating the sum thereof; and
   a quantizer for receiving the output of said output summing junction and generating both the m'-bit output of the delta-sigma converter and the feedback signal for input to said input summing junction;
   said n integration stages each having:
     an adder having two inputs,
     a data register medium for temporarily storing an output of said adder and having at least one register that is operable to present on an output thereof more than one accumulated value at different times for a given digital input,
     a multiplexing device for multiplexing the operation of said adder for each word received from said input summing junction to perform a plurality of summations with the value of the digital input and previously stored values from said data register medium to perform the operation of each stage of integration and store the result in said data register medium as accumulated values, and an output device for selecting the accumulated values for input to said output summing junction after generation thereof in accordance with the operation of the associated integration stage thereof.

2. The delta-sigma converter of claim 1 wherein the value of n is equal to four to provide a fourth order delta-sigma converter.

3. The delta-sigma converter of claim 1 wherein the value of m' is equal to one.

4. The delta-sigma converter of claim 1 wherein said data register medium comprises n dynamic data registers, each for temporarily storing the accumulated value output by said adder, said data registers controlled by said multiplexing device.

5. The delta-sigma converter of claim 4 wherein said multiplexing device is operable to control said dynamic data registers to operate in a serial fashion to perform the summations in said adder n times for each word output by said input summing junction, and for each summation to serially process the accumulated values from one of said data registers to the next serial one thereof with the output of the last one of said registers in the serial configuration input to one input of said adder with the output of said adder connected to the input of the first of said registers.

6. The delta-sigma converter of claim 5 wherein said multiplexing device comprises:

an input multiplexer connected to the first input of said adder for selecting either the output of said input summing junction or the output of the next to the last of said data registers in the serial configuration;

a timing control device for controlling said input multiplexer in the first summation operation after receiving a digital word from said input summing junction to input said received word to one input of said adder and store the accumulated value in the first of said data registers in the serial configuration, and in the subsequent n-1 summations to connect the output of the next to the last one of said data registers to the input of said adder for summation with the output of the last of said adders in the serial configuration and to sequence the accumulated values stored in each of said registers for each summation operation through the serial configuration of said registers such that each value generated on the output of said adder is presented to the input of said adder after n summations.

7. The delta-sigma converter of claim 6 wherein said output device comprises:

n scaling devices for receiving the output of the first one of said data registers in said serial configuration and performing the scaling factor associated with each of the stages of integration; and a multiplexer for selecting a predetermined one of the outputs of said scaling devices in accordance with the stage of integration associated with the data stored in the first one of said data registers in the serial configuration.

8. The delta-sigma converter of claim 4 and further comprising an overflow detector for detecting an overflow value output by said adder and for setting a predetermined one of said data registers to a predetermined value in response thereto.

9. The delta-sigma converter of claim 8 wherein the next to the last one of said data registers is the one thereof that is set by said overflow detector.

10. A digital delta-sigma modulator having at least two stages of integration, the at least two stages of integration comprising:

an adder having two inputs;

a plurality of data registers connected in a serial configuration, the input of the first of said data registers connected to an output of said adder, and an output of the last of said data registers connected to one input of said adder;

a multiplexer having two inputs and one output, said output connected to the other input of said adder, one of said inputs of said multiplexer connected to an external data signal and the other of said inputs connected to the output of one of said registers;

an output device for selecting the output of one of said registers for output therefrom; and a timing device for sequencing the output of said adder through said registers as an accumulated value and, at a select time, controlling said multiplexer to input said external data signal to the other input of said adder for summation with the output of the last of said data registers.

11. The circuit of claim 10 wherein the one of said data registers having the output thereof connected to the other input of said adder when said external signal is not routed thereto is the next to the last of said data registers.

12. The circuit of claim 10 and further comprising clearing circuitry for setting the values stored in said data registers to a predetermined value.

13. The circuit of claim 12 wherein said clearing circuitry is operable to set the output of one of said data registers to a predetermined value.

14. The circuit of claim 12 and further comprising an overflow detect circuit for detecting an overflow in said adder and forcing said clearing circuitry to set the value of said data registers to said predetermined value in response to the detection of an overflow condition.

15. A method for performing a delta-sigma conversion in a digital-to-analog converter by receiving an m-bit digital word at a sampling rate and converting it to an m'-bit digital word, m' being less than m, comprising the steps of:

receiving as a digital input the m-bit digital word and a feedback value and summing the two values together to provide a first output sum;

performing n stages of integration on the output sum;

scaling the output after each integration step for output along an associated feed-forward path;

summing each of the outputs of the feed-forward paths at an output summing junction to provide a second output sum; and quantizing the second output sum to generate the m'-bit output of the delta-sigma conversion operation;

the step for performing the n-integration stages comprising:

providing an adder having two inputs;

providing a data register medium for temporarily storing an output of the adder and having at least one register that is operable to present on an output thereof more than one accumulated value at different times for a given digital input, multiplexing the operation of the adder for each word received in the input summing operation to generate a first output sum and performing n summations with the value of the digital input and previously stored values in the data register medium to perform the operation of each stage of integration and storing the results in the data register medium as accumulated values, and selecting the accumulated values for input to the output summing junction after generation thereof in accordance with the operation of the associated integration stages thereof, the step of selecting also operable to perform the associated scaling operations.

16. The method of claim 15 wherein the value of n is equal to four.

17. The method of claim 15 wherein the value of m' is equal to one.

18. The method of claim 15 wherein the step of providing the data register medium comprises providing n dynamic data register, each for temporarily storing one of the accumulated values for each stage of integration.

19. The method of claim 18 wherein the step of multiplexing comprises configuring the dynamic data registers in a serial configuration with the output of the adder input to the first of the data registers in the serial configuration and the output one of the data registers in the serial configuration providing one input to the adder, the step of multiplexing controlling the other of the inputs of the adder to receive the first output sum or the output of the next to the last of the data registers, the multiplexing operation sequencing the accumulated data values output by the adder through the data registers.

20. The method of claim 19 wherein the step of multiplexing comprises:

providing an input multiplexer having two inputs, one for receiving the first output sum and the other for receiving the output of the next to the last of the data registers in the serial configuration, the output of the input multiplexer being connected to the other input of the adder; and controlling the multiplexer and data registers such that multiple summations are performed for each word that is received by the delta-sigma converter such that the first summation step sums the output of the last of the data registers in the serial configuration with the first output sum and stores the output thereof in the first of the data registers and, for subsequent operations, the data is sequenced through the serial configuration of data registers and presented to one input of the adder for performing the operations of the n-1 stages of integration.

21. The method of claim 20 wherein the step of selecting the accumulated values comprises selecting the output of the first of the data registers in the serial configuration and inputting the output to one of four scaling devices and selecting the output of one of the four scaling devices in accordance with the stage of integration that corresponds to the data stored in the first of the data registers in the serial configuration for the appropriate output feed-forward path, these outputs summed by the output summing step.

22. The method of claim 18 and further comprising detecting an overflow in the adder and setting one of the data registers to a predetermined value in response to detection of an overflow.

23. The method of claim 22 wherein the register to be set is the next to the last of the data registers in the serial configuration.

24. A method for performing a digital delta-sigma modulation and performing at least two stages of integration, the step of performing at least two stages of integration comprising the steps of:

providing an adder having two inputs, each for receiving an input value;

providing a plurality of data registers;

configuring the data registers in a serial configuration;

summing the input values on the inputs to the adder and inputting as stored sum values the sum provided therefrom into the input of the first of the data registers in the serial configuration;

sequencing the sum values stored in the data registers through the serial configuration of data registers;

outputting the value from the last of the data registers and inputting it to one input of the adder;

inputting an external data signal into the other input of the adder for one cycle of the sequencing operation of the registers; and selecting the output of one of the data registers for input to the other input of the adder when the external data signal is not connected to the other input of the adder.

25. The method of claim 24 wherein the one of the data registers having the output thereof input to the other input of the adder when the external data signal is not input to the one input of the adder comprises connecting the output of the next of the last data registers to the other input of the adder when the external data signal is not connected to the one input of the adder.

26. The method of claim 24 and further comprising setting the values stored on the outputs of the data registers to a predetermined value at a select time.

27. The method of claim 26 wherein the step of setting comprises setting the output of only one of the data registers to a predetermined value.

28. The method of claim 26 wherein the step of setting further comprises the steps of:

detecting an overflow condition in the adder; and performing the operation of setting in response to detecting an overflow.

* * * * *